Oct. 29, 1968 B. T. WALKER 3,407,984

SOLDER FLOW REVERSING APPARATUS

Filed April 25, 1966

Inventor
Brian T. Walker
By Kemon Palmer Stewart & Estabrook
Attorneys 3,407,984

SOLDER FLOW REVERSING APPARATUS

Brian Thomas Walker, Luton, England, assignor to British Aircraft Corporation (Operating) Limited, a British company Filed Apr. 25, 1966, Ser. No. 544,760
Claims priority, application Great Britain, Apr. 28, 1965, 17,888/65
3 Claims. (Cl. 228—37)

In one known method of soldering components to printed circuits, the surface of a board which bears the printed pattern and through which project the pins of components to be connected into the metallic pattern, is coated with flux and is then passed over a wave of molten solder. The molten solder is pumped through a fishtail nozzle extending transversely to the direction of movement of the printed circuit board and overflows on both sides of the nozzle to form a smoothly rounded wave.

We have found that this process sometimes leads to icicles of solder extending from the connections on the finished board. According to the present invention, the formation of icicles of solder is substantially reduced by ensuring that the solder wave emerging from the nozzle flows past the path of the printed circuit board in a direction opposite to the direction of travel of the board. This may be achieved by providing an inclined lip on one side of the nozzle to reverse the direction of flow of the solder which would otherwise fall over that side. We believe that the explanation of the improvement brought about by this modification is that when the board and the rear portion of the over-flowing solder wave were both moving in the same direction, the solder on the printed circuit board was dragged downwardly as the solder wave fell away and that this produced the icicles; with the process according to the present invention, the solder wave and the board on which the solder is being deposited are travelling in opposite directions and this does not occur. In the preferred form of the invention, the path of the printed circuit board has an upward inclination as the board passes over the molten solder wave. We have found that this provides a further improvement in the prevention of unnecessary solder extending from the joints.

One advantage of a reduction to the minimum amount of solder is that the space between conductor lines on the printed circuit board can be reduced and the invention thus provides a further advance in the process of miniaturisation of electrical and electronic circuits.

In order that the invention may be better understood, one example will now be described with reference to the accompanying drawings, in which:

FIGURE 1 shows a printed circuit board 10 from the underside of which project pins 11 of components located on the upper side of the board. These pins have to be soldered to the metallic printed pattern on the circuit board.

Figure 1:
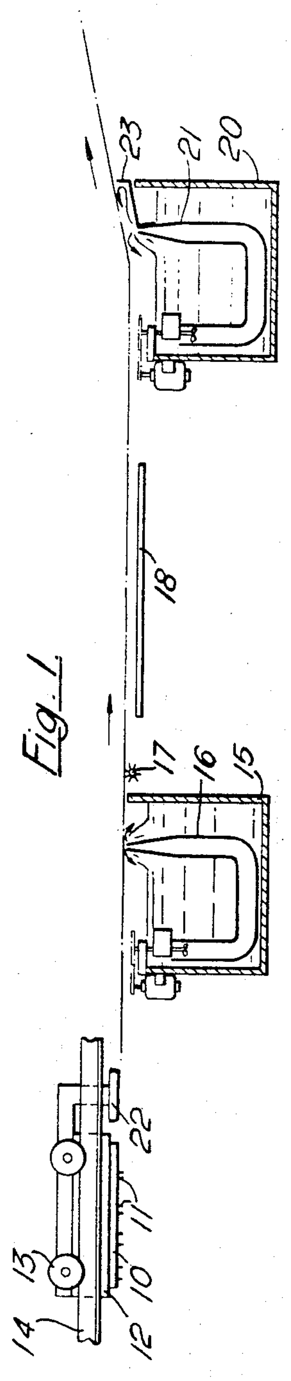
FIGURE 1 shows diagrammatically a production line for soldering the connections on the printed circuit board.
Figure 2:
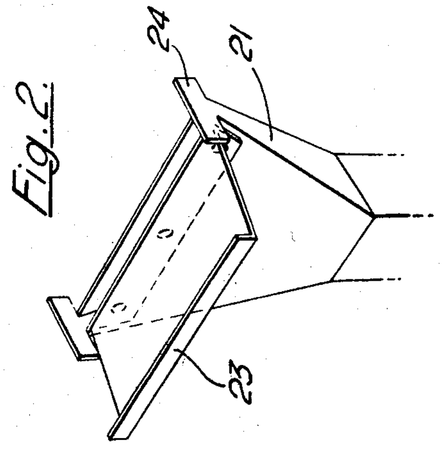
FIGURE 2 illustrates the form of the soldering nozzle.

The board is supported by a carrier 12, the wheels 13 of which run on rails 14 which guide the carrier along the production line. The carrier first passes fluxing apparatus including a flux container 15 in which is located a nozzle 16 having an inlet below the surface of the flux and an outlet which extends in a direction perpendicular to the path of the printed circuit board. A pump drives solder through the nozzle 16 so that it overflows from the top of the nozzle in a rounded wave and falls back into the container 15.

After skimming over the flux wave, the printed circuit board encounters a brush 17 which removes surplus flux.

The board then passes over heaters 18 and on to a solder delivery apparatus similar in many respects to the fluxing apparatus earlier in the production line. The solder is contained in a container 20 and is driven through a nozzle 21 to form a wave overflowing from the nozzle and contacting the surface of the printed circuit board as it passes along the production line. Solder is deposited on to the fluxed metallic portions to be joined.

The modification brought about by the present invention is that the solder wave emerging from the nozzle 21, instead of overflowing back into the container 20 in both directions (that is to say in the direction of movement of the printed circuit board and in the opposite direction) falls back into the container on the side first reached by the printed circuit board but on the other side has its direction reversed by a lip 23. When its direction is reversed by the lip 23, the solder is travelling in the same direction as the wave overflowing on the first side of the nozzle, this direction being opposite to the direction of movement of the printed circuit board. The solder which strikes the lip 23 is thrown upwards and backwards so that the solder which the board meets is all travelling in a direction opposite to that of its own travel and the effect of this is to reduce substantially the formation of icicles of solder.

After passing the solder wave, the printed circuit board travels along an upwardly inclined path. We have found that an angle of inclination of about 8½° with a speed of travel of the panel of about 5½ feet per minute gives satisfactory results. This upward inclination further reduces the possibility of formation of solder icicles.

In the example shown, a flux plate 22 is attached to the carrier which supports the printed circuit board. This plate precedes the printed circuit board as it passes over the flux and solder waves. As it passes over the solder wave, the flux plate removes the dross from the surface of the wave and deposits flux on to the wave surface. This flux spreads over the full length of the surface of the solder wave and the resulting flux film prevents further dross from forming by oxidation of the solder in the interval between the passage of the flux plate and the passage of the printed circuit board.

This feature which forms the subject of the copending application No. 544,743, gives a further improvement in the quality of the resulting solder joints.

I claim:

1. Solder delivery apparatus comprising:
- a container for solder;
- a nozzle terminating in an elongated exit;
- a pump for forcing solder from said container through the nozzle and exit;
- an upwardly inclined guiding member mounted at one long side of said elongated exit;
- and an upstanding lip extending from said guiding member;
- whereby solder which flows on to said guiding member on emerging from said exit is subsequently reversed in direction by said lip to form a solder wave moving over and in a direction opposite to the solder travelling up said guiding member from said exit.

2. Apparatus for wave soldering to connect metallic parts mounted on a board, comprising:
- a carrier for a board on which are mounted parts to be connected;
- means for guiding said carrier along a predetermined path;
- a container for solder;
- a nozzle connected to said container and having an elongated exit adjacent to said predetermined path and extending transversely to said path;
- a pump for forcing solder from said container through said nozzle;

an upwardly inclined guiding member extending from one long side of said elongated exit under the predetermined path and in the direction of movement of said carrier and board along said path;

and an upstanding lip extending from the end of said guiding member;

whereby solder which flows on to said guiding member on emerging from said exit is subsequently reversed in direction by said lip to form a solder wave moving over and in a direction opposite to the solder travelling up said guiding member, said reversed solder wave contacting the parts on the board as it is carried along said predetermined path.

3. Apparatus in accordance with claim 2, in which said guiding means for said carrier presents a generally horizontal path for said carrier before it reaches the solder delivery device and an upwardly inclined path for said carrier as it passes through and beyond the solder wave formed by said solder delivery device.

References Cited

UNITED STATES PATENTS

| | | | |
|---|---|---|---|
| 2,869,497 | 1/1959 | Lehner | 29—503 X |
| 3,039,185 | 6/1962 | Oates | 29—503 |
| 3,100,471 | 8/1963 | Gutbier | 29—503 X |
| 3,277,566 | 10/1966 | Christensen | 29—626 |

JOHN F. CAMPBELL, *Primary Examiner.*

J. CLINE, *Assistant Examiner.*